United States Patent [19] [11] 4,068,462
Duff et al. [45] Jan. 17, 1978

[54] FREQUENCY ADJUSTMENT CIRCUIT

[75] Inventors: Donald R. Duff, Mountain View; James O. Lamb; Donald E. Pezzolo, both of Cupertino, all of Calif.

[73] Assignee: Fairchild Camera and Instrument Corporation, Mountain View, Calif.

[21] Appl. No.: 687,053

[22] Filed: May 17, 1976

[51] Int. Cl.[2] ............ G04C 3/00; H03F 1/00
[52] U.S. Cl. ............ 58/23 AC; 58/23 R; 328/129; 331/175
[58] Field of Search ............ 58/23 R, 23 AC, 50, 58/85.5; 328/37, 129; 331/175

[56] References Cited

U.S. PATENT DOCUMENTS

| | | | |
|---|---|---|---|
| 3,756,014 | 9/1973 | Zatsky | 58/28 R |
| 3,852,951 | 12/1974 | Sauthier | 58/23 R |
| 3,895,486 | 7/1975 | Hammer | 58/85.5 |

*Primary Examiner*—Edith S. Jackmon
*Attorney, Agent, or Firm*—Alan H. MacPherson; Henry K. Woodward; Norman E. Reitz

[57] ABSTRACT

A circuit for adjusting the frequency of operation of an electronic time keeping device, which device includes a source of clock pulses. The circuit of this invention is preferably located between the source of clock pulses and the time keeping device counting circuitry, so that the clock pulses can be periodically interrupted for a programmed amount of time. Accordingly, the variable adjustment capacitor, typically employed in prior art time keeping devices, can be eliminated.

8 Claims, 5 Drawing Figures

FREQUENCY ADJUSTMENT CIRCUIT

BACKGROUND OF THE INVENTION

1. Field of the Invention

This invention relates to electronic time keeping devices, and in particular to a new and improved means and method for adjusting the frequency of operation of an electronic time keeping device.

2. Description of the Prior Art

Time keeping devices, which employ electronic circuitry for providing electrical signals to indicate the correct time, are known in the art. In a typical device, an extremely stable high frequency oscillator supplies time base signals or pulses. These signals are divided down by known circuitry which supplies a signal train of pulses having a frequency of 1 Hz. This signal train is coupled to a time keeping unit comprising a number of counters which are incremented by the 1 Hz pulses. A scale of 60 counter provides a count representative of the correct second of the minute. Another scale of 60 counter provides a count representative of the correct minute of the hour. A scale of 12 counter provides a count representative of the correct hour of the day. In some devices, additional counters are included to provide a count representative of the day of the month, day of the week, and month of the year.

The outputs of the time keeping unit counters are decoded, and typically are coupled to a multidigit liquid crystal or light emitting diode display means. As the counters are clocked to different states by the 1 Hz clock pulses, the decoded outputs are supplied either directly, or indirectly by means of an enabling display switch, to the display means, thereby providing a visual output indicating the time.

Time keeping systems of the above type provide a degree of accuracy which surpass conventional mechanical movements, primarily due to the high frequency time base employed and the excellent frequency stability of electronic digital circuitry. Also, fully electronic systems are less expensive to manufacture than mechanical systems, and exhibit a much longer lifetime since there are no moving mechanical parts. However successful development of smaller and lower cost electronic watches, which also maintain a high degree of accuracy, has been impeded by the use of such components as a variable capacitor and a quartz crystal for stablizing the base signal at a precise frequency.

The typical prior art electronic wristwatch employs a quartz crystal as a means for stablizing the frequency of oscillation of the base signal generating oscillator. Further, since quartz crystals can only stabilize the frequency of oscillation within a reasonable range of frequencies, a pair of capacitors are typically employed with the oscillator to further adjust and stablize the frequency of oscillation. One of these capacitors is generally fixed and the second is variable. After assembly of an electronic wristwatch module the variable capacitor must be precisely adjusted to cause the oscillator to generate the precise frequency of oscillation desired. Needless to say, this operation is time consuming, and if it becomes necessary to readjust the frequency of oscillation after some period of time, the wristwatch must be returned to someone having the proper equipment to make this adjustment. Furthermore, the capacitors consume critical space within the wristwatch and they are costly components.

Another costly and space consuming component of the typical prior art electronic wristwatch module is the quartz crystal. Though some means of stablizing the frequency of oscillation of the base signal generation is required, other means may be provided as set forth in greater detail hereinbelow.

SUMMARY OF THE INVENTION

The invention disclosed and claimed herein is a low cost yet highly accurate means for stablizing and adjusting the frequency of oscillation of the base frequency generation means for an electronic time keeping device.

In accordance with this invention, a circuit is provided for tuning the frequency of operation of an electronic time keeping device including a source of clock pulses, which circuit comprises the means for storing a numeric code representative of a time delay of the clock pulses having a plurality of data output terminals; means for counting a time interval in proportion to the numeric code, including a plurality of data input terminals coupled to respective ones of the data output terminals of the means for storing, and a plurality of data output terminals; circuit means having a first input coupled to the source of clock pulses, a first clock output terminal coupled to the means for counting, a plurality of data input terminals coupled to respective ones of the data output terminals of the means for counting and a second clock output terminal disposed for supplying clock pulses of an adjusted frequency to the electronic time keeping device.

DETAILED DESCRIPTION

Figure 1:
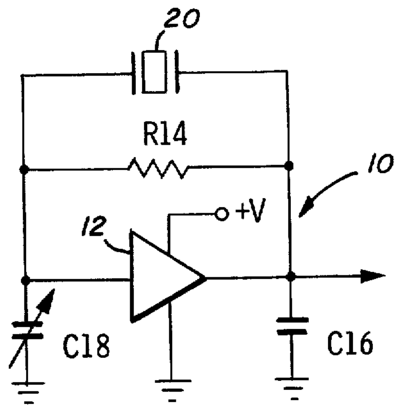
FIG. 1 is a schematic diagram of a prior art time keeping device oscillator with frequency stabilization means.

Referring now to FIG. 1, a schematic diagram of a typical prior art oscillator device 10 with frequency stablization means is illustrated. In particular, the oscillator circuit 10 comprises an amplifier 12, coupled across a voltage source, a resistor R14 coupled across the input and output terminals of the amplifier 12, and capacitors C16 and C18. Capacitor C16 is coupled between the output of the amplifier 12 and a reference potential, and capacitor C18, which is typically a variable capacitor, is coupled between the input terminal of the amplifier 12 and the reference potential. In order to stabilize the frequency of operation of the oscillator 10, a quartz crystal 20 is coupled across the input and output terminals of the amplifier 12. In the art of electronic time keeping devices, it is desirable to have the frequency of operation and the oscillator 10 at a fixed frequency (e.g., 32,768 Hz wherein the pulse width between consecutive pulses is 30.5 microseconds). As is generally the case, a quartz crystal is employed to stabilize the frequency of operation at approximately 32,768 Hz. It is pointed out, however, that other frequencies of operation of the oscillator may be used, as for example 700KHz, wherein the time keeping device circuitry is designed also to provide signals indicative of seconds, minutes, hours, etc. The frequency of operation of the oscillator is adjusted by means of the capacitor C18 to arrive at the precise frequency desired. This adjustment of capacitor C18 is a principal disadvantage of the prior art oscillator circuit which is to be overcome by the circuit of the present invention.

Figure 2:
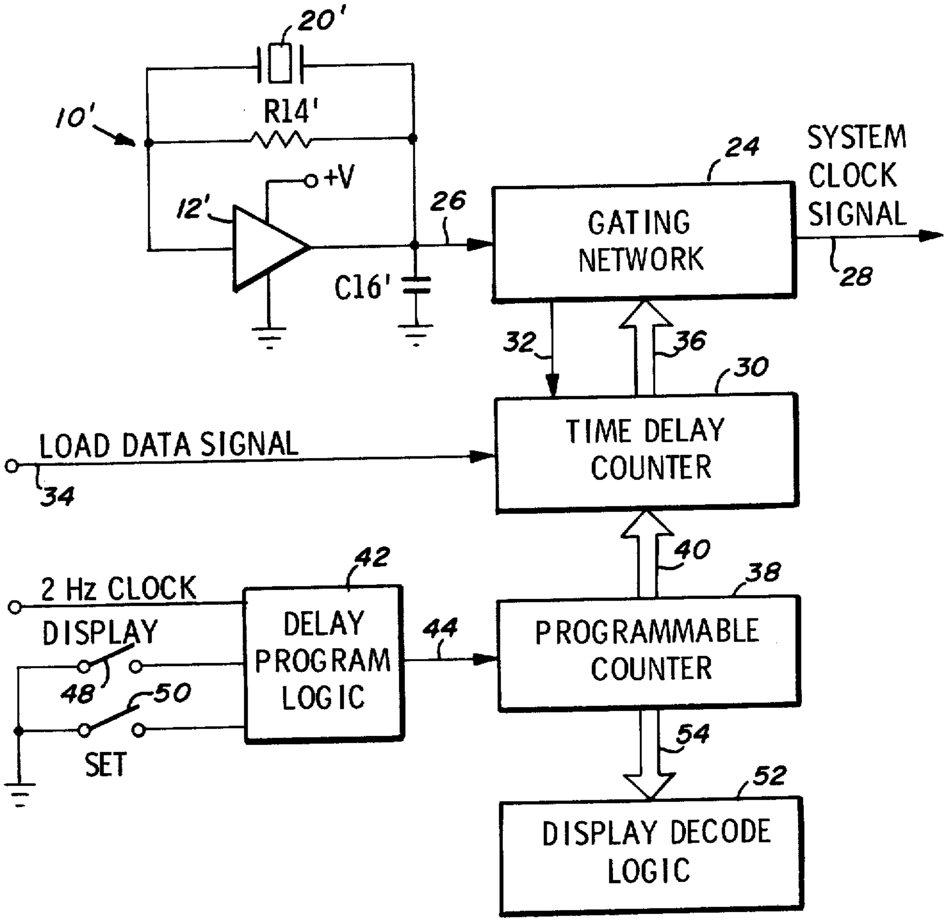
FIG. 2 is a block diagram of the circuit of the present invention.

Referring now to FIG. 2, a block diagram of the circuit of the present invention is illustrated. An oscillator circuit 10' is employed to generate an OSCILLATOR CLOCK SIGNAL, which is coupled to the input of a gating network 24 on a line 26. The oscillator circuit 10' is similar to the prior art oscillator circuit 10 illustrated in FIG. 1 and described hereinabove. Like reference numerals with a prime are employed in FIG. 2 for the oscillator circuit 10'. Note that the variable capacitor C18 has been removed from the oscillator circuit 10'. A SYSTEM CLOCK SIGNAL is supplied on an output line 28 from the gating network 24, which clock signal is tuned by the circuit of the present invention.

A gated clock signal is supplied from the gating network 24 to a time delay counter 30 on a line 32. In addition, a LOAD DATA SIGNAL is periodically supplied to an enable data entry input of the counter 30 on a line 34. The LOAD DATA SIGNAL may for example be supplied to the counter 30 every 10 seconds, or 80 seconds, or any other rate depending upon the tuning accuracy desired and the size of the counter 30.

Time delay counter 30 in one embodiment comprises a "count-down" counter having output terminals coupled to data input terminals of the gating network 24 by means of a plurality of data lines 36. Data are loaded into the time delay counter 30 from a programmable counter 38 by means of a plurality of data lines 40. Programmable counter 38 in one embodiment comprises an "up-counter, " wherein a numeric code is entered into the programmable counter 38 in accordance with the number of pulses supplied at a clock input terminal thereof. The pulses are supplied to the programmable counter 38 from a delay program logic 42 by means of a line 44. The delay program logic 42 is operative in response to a clock signal (typical 2Hz) supplied on a line 46, and simultaneous closure of DISPLAY and SET switches 48 and 50 of the time keeping device. The value of the numeric code is determined by the number of pulses supplied to counter 38 during the time at which the DISPLAY and SET switches are held closed. Thus, the user determines the value of the numeric code entered into the programmable counter 38.

The data output terminals of the programmable counter 38 are supplied to display decode logic 52 of the electronic time keeping device by means of data lines 54. This connection allows the user to see the numeric code being entered into the programmable counter 38.

In operation, the OSCILLATOR CLOCK SIGNAL supplied on the line 26 is periodically interrupted by an amount of time determined by the numeric code entered into the time delay counter 30 from the counter 38. That is, the number of pulses removed from the OSCILLATOR CLOCK SIGNAL before being supplied as the SYSTEM CLOCK SIGNAL is equal to the value for the numeric code entered into the counter 30. The numeric code entered into the time delay counter 30 is determined by the numeric code entered into the programmable counter 38 as described above.

Figure 3:
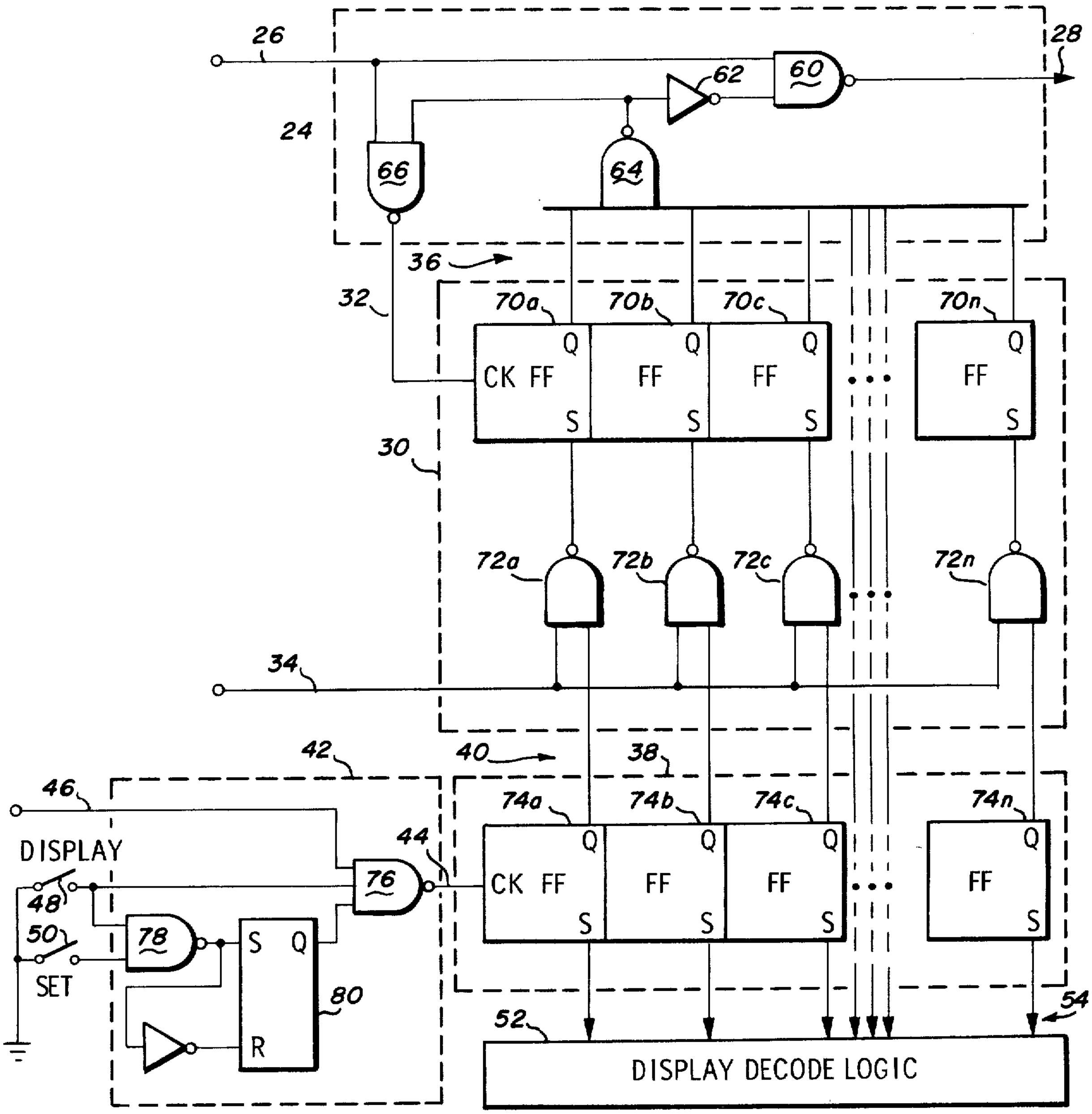
FIG. 3 is a logic diagram of the circuit of the present invention.

Referring now to FIG. 3, a logic diagram of the present invention is illustrated. Dashed lines and like reference numerals illustrated in FIG. 3 to identify the corresponding blocks illustrated in FIG. 2 and described hereinabove. It is to be noted that the logic symbols employed in FIG. 3, and referred to in the description hereof, are by means of illustration only and not by way of limitation.

The gating network 24 typically comprises a NAND gate 60 having a first input coupled to the OSCILLATOR CLOCK SIGNAL line 26, an output coupled to the SYSTEM CLOCK SIGNAL line 28 and a second input terminal coupled to the output terminal of the inverter 62. The input terminal of the inverter 62 is coupled to the output terminal of a second NAND gate 64, and to a first input of a third NAND gate 66. The second input of the NAND gate 66 is also coupled to the OSCILLATOR CLOCK SIGNAL line 26. The output terminal of the NAND gate 66 is coupled to the line 32, which is coupled to the clock input terminal of the time delay counter 30. Input terminals of the NAND gate 64 are coupled to data output terminals of the time delay counter 30 by means of the lines 36.

The time delay counter 30 typically comprises a plurality of flip-flops 70*a* through 70*n*, wherein the number of flip-flops actually employed is determined by the degree of adjustment accuracy desired. Flip-flops 70*a* through 70*n* are coupled together in a conventional manner to "count down" the numeric code stored in the counter 30 in response to the clock signal supplied on the line 32 to the clock input of the first flip-flop 70*a*. Accordingly, when counter 30 reaches a value of zero following a time delay determined by the time required for the OSCILLATOR CLOCK SIGNAL gated through NAND gate 66 to count down the counter, the output of NAND gate 64 enables NAND gate 60 to again pass the OSCILLATOR CLOCK SIGNAL there through to the system. On the other hand, counter 30 could comprise an "up counter" and gate 64 could comprise an AND gate, thereby providing a time delay as a function of the time required to count counter 30 up to an output state of all "ones." In addition, any other combination of the state of the output of counter 30 can be employed.

The data or true (Q) outputs of the flip-flops 70*a* through 70*n* are coupled to the lines 36, and the set (S) inputs of the flip-flops 70*a* through 70*n* are coupled to output terminals of a corresponding number of NAND gates 72*a* through 72*n*, respectively. The first input of each of the NAND gates 72*a* through 72*n* is coupled to the LOAD DATA SIGNAL line 34. The second input terminals of the NAND gates 72*a* through 72*n* are coupled to the data lines 40 from the programmable counter 38.

Programmable counter 38 typically comprises a plurality of flip-flops 74*a* through 74*n* wherein the number of flip-flops employed for counter 38 is determined by the tuning accuracy desired, and corresponds to the number of flip-flops employed within the time delay counter 30. In one embodiment flip-flops 74*a* through 74*n* are coupled together in a conventional manner to form an "up-counter" suitable for deriving a numeric code in response to a series of pulses supplied to the clock (CK) input terminal of the flip-flop 74*a*. The numeric code stored in the counter 38 corresponds to the number of pulses supplied on the line 44 from the delay program logic 42. The data or true (Q) outputs of the flip-flops 74a through 74n are coupled to the lines 40 which are supplied to the time delay counter 30. The data or true (Q) outputs of the flip-flops 74a through 74n are also coupled to the display decode logic 52 by means of the lines 54.

The delay program logic 42 typically comprises a NAND gate 76 having an output terminal coupled to the line 44, which is coupled to the clock (CK) input terminal of the flip-flop 74a. A first input terminal of the NAND gate 76 is coupled to the line 46, which supplies clock pulses at a typical frequency of 2 Hz. The second input terminal of the NAND gate 76 is coupled to the normally open terminal of the DISPLAY switch 48 of the time keeping device. In addition, the normally open terminal of the DISPLAY switch 48 is coupled to the first of two inputs of a second NAND gate 78. The second input terminal of the NAND gate 68 is coupled to the normally open terminal of the SET switch 50 of the time keeping device. The operating terminals of the switches 48 and 50 are coupled to a reference potential.

The output terminal of the NAND gate 78 is coupled to the set (S) input terminal of a flip-flop 80. The data or true (Q) output terminal of the flip-flop 80 is coupled to the third input terminal of the NAND gate 76. The reset (R) input terminal of the flip-flop 80 is coupled to the output terminal of an inverter 81, which has an input terminal thereof coupled to the output terminal of the NAND gate 78.

In operation, switches 48 and 50 are simultaneously closed, thereby enabling the NAND gate 78 to set flip-flop 80. This places the electronic time keeping device in a "timing frequency set" mode. Thus, when flip-flop 80 is set and the SET switch 48 is closed, the pulses supplied on the line 46 are gated through the NAND gate 76 onto the line 44 and to the clock (CK) input terminal of the flip-flop 74a. While the delay program logic 42 is in this state, clock pulses are supplied to the programmable counter 38. Thus, a numeric code is entered into the programmable counter 38, and is displayed by the display means of the electronic time keeping device through the display decode logic 52. After the desired numeric code is entered into the programmable counter 38, flip-flop 80 is reset when the NAND gate 78 is disabled. Thereafter, every time a LOAD DATA SIGNAL pulse is supplied on the line 34, the numeric code stored in the programmable counter 38 is entered into the time delay counter 30 by means of the NAND gates 72a through 72n.

It is pointed out that the delay program logic 42 is by way of example only since there are various other ways of accomplishing the same results. For example, this circuitry can form part of the time keeping device circuitry, wherein the function of the flip-flop 80 is a state of a counter circuit, which state can only be reached by pressing and holding the SET switch 50 closed followed by pressing the DISPLAY switch 48.

The numeric code stored in the programmable counter 38 is now entered into the time delay counter 30, and the output states of the flip-flops 70a through 70n disable the NAND gate 64. Every time counter 30 is in a state other than zero, NAND gate 64 disables the NAND gate 60 thereby stopping the SYSTEM CLOCK SIGNAL on the line 28. The NAND gate 66 is enabled at this time, and the OSCILLATOR CLOCK SIGNAL supplied on the line 26 is coupled to the clock (CK) input terminal of the flip-flop 70a of the time delay counter 30. Counter 30 will count down in response to the clock signal supplied on the line 32. Once counter 30 reaches a state of zero, the output of the NAND gate 64 changes, thereby enabling the NAND gate 60 to pass the OSCILLATOR CLOCK SIGNAL on the line 26 through to the SYSTEM CLOCK SIGNAL on the line 28. The cycle described hereinabove will be repeated each time a LOAD DATA SIGNAL is supplied on the line 34 transferring the numeric code stored in the programmable counter 38 to the time delay counter 30.

Figure 4:
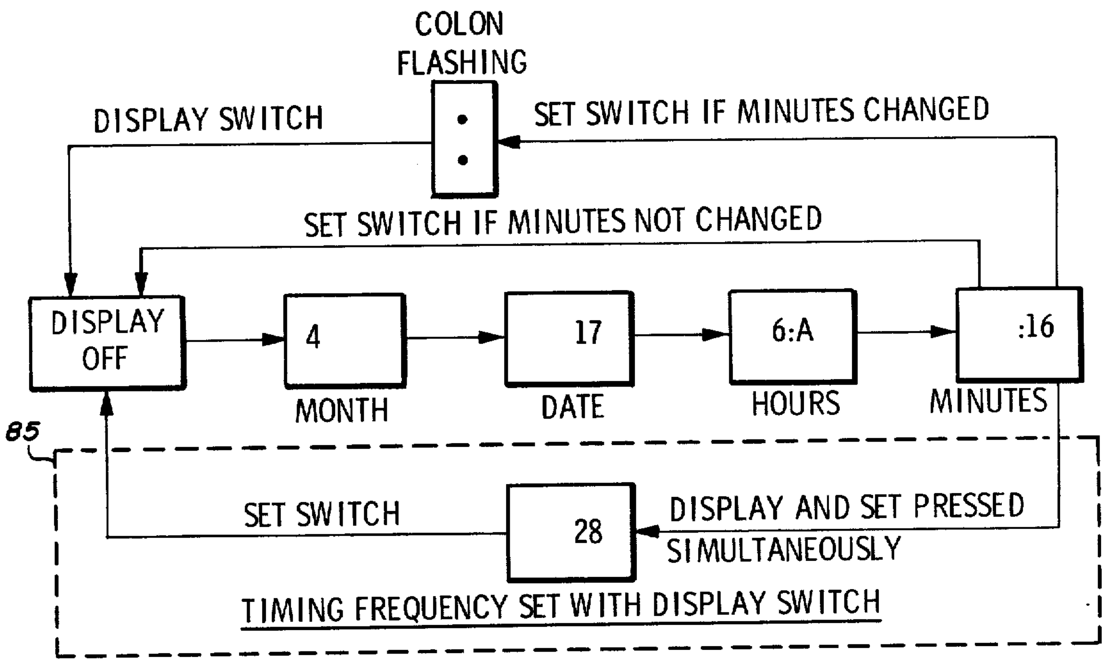
FIG. 4 is a functional diagram of the modes of operation of a typical time keeping device, including a functional diagram of the mode of operation of the present invention; and, FIG. 5 is a timing diagram of the circuit of the present invention.

Referring now to FIG. 4, a functional block diagram of the operation of an electronic time keeping device is illustrated. The portion of FIG. 4 without dashed line 85 represents the prior art functions of setting the month, day, hours and minutes. Simultaneous depression of the DISPLAY and SET switches of the time keeping device places the device in the "timing frequency set" mode, as represented by the function enclosed within the dashed lined 85. The number displayed on the face of the time keeping device represents the numeric code being entered into the programmable counter 38. Once the numeric code for the desired frequency delay has been reached, the DISPLAY switch is released, and the SET switch is depressed again to return the time keeping device to normal operation.

Figure 5:
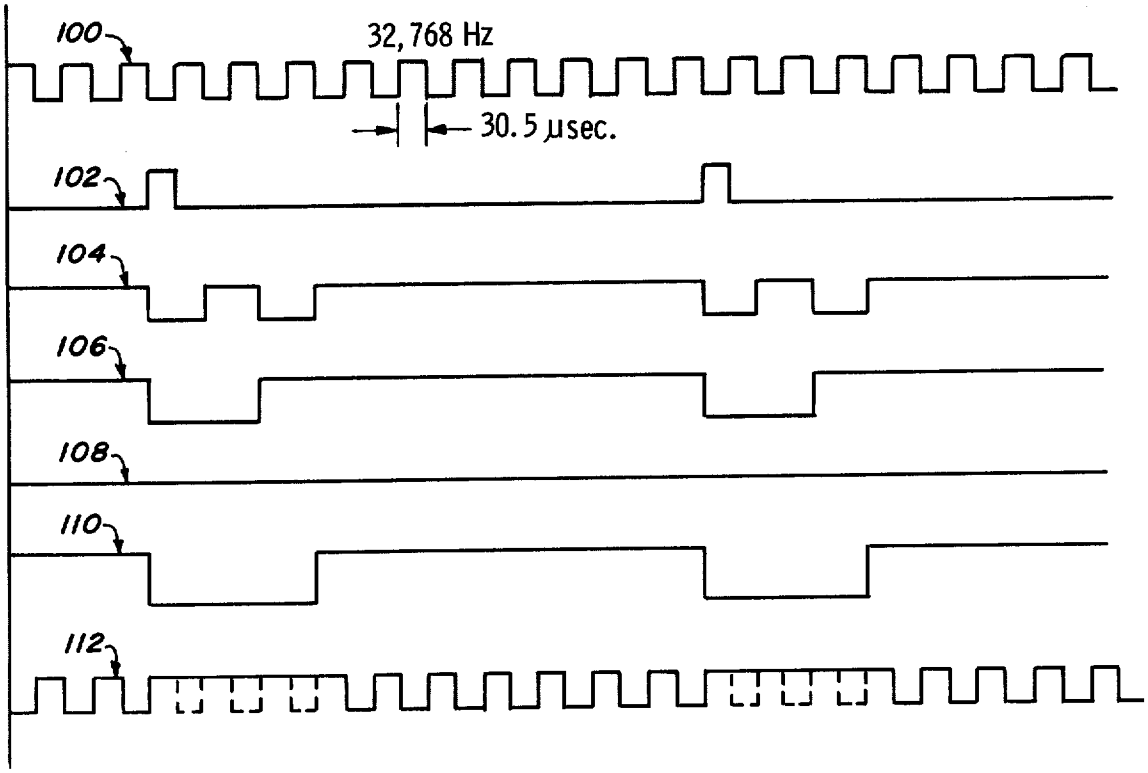

Referring now to FIG. 5, a timing diagram of the operation of the circuit of the present invention is illustrated. Waveform 100 represents the OSCILLATOR CLOCK SIGNAL supplied on the line 26. The frequency of oscillation of the clock signal is preferably 32,768 Hz with a pulse width of 30.5 microseconds. Assume, for example, that it is desired to remove three pulses from the OSCILLATOR CLOCK SIGNAL every 10 seconds. Waveform 102 represents the LOAD DATA SIGNAL supplied on the line 34, and for the present assumed example is a single pulse occurring every 10 seconds. Simultaneous depression of the DISPLAY and SET switches 48 and 50 will place the time keeping device in the "timing frequency set" mode. Also, for the assumed example, the DISPLAY switch is held depressed until the numeric code for 3 is entered into the programmable counter 38. During entry of the numeric code for 3 into the programmable counter 38, the contents of counter 38 are simultaneously displayed through the display decode logic 52. Once the desired numeric code is entered into the counter 38, herein the number 3, this numeric code is transferred to the time delay counter 30 when a pulse is supplied on the LOAD DATA SIGNAL line 34. Waveform 104 represents the true (Q) output of the flip-flop 70a, and Waveform 106 represents the ture (Q) output of the flip-flop 70b.

During the time that NAND gate 64 is enabled, NAND gate 66 is enabled to transfer the OSCILLATOR CLOCK SIGNALS on the line 26 to the clock (CK) input of the counter 30 and the flip-flop 70a in particular. Waveform 108 represents the true (Q) output of the flip-flop 70c, which does not change for a binary code representing the numeric code 3. Waveform 110 represents the output of the inverter 62, which disables the NAND gate 60. Waveform 112 represents the SYSTEM CLOCK SIGNAL supplied on the line 28 at the output of the NAND gate 60. During subsequent clock pulses of the OSCILLATOR CLOCK SIGNAL on the line 26, the state of the counter 30 is changed as indicated by Waveforms 104 and 106. Once the binary code for the number 3 is counted down to zero, the output of the inverter 62 (as indicated by Waveform 110) is returned to a normal level thereby enabling NAND gate 60. Note in Waveform 112, that the period of time at which NAND gate 60 has been disabled, three clock pulses have been subtracted from the SYSTEM CLOCK SIGNAL supplied on the line 28.

It may be appreciated from the description hereinabove that a new and improved means and method for adjusting the frequency of operation of an electronic time keeping device has been described in detail. Thus, while the invention has been particularly shown and described with reference to one embodiment, it will be understood by those skilled in the art that the foregoing and other changes in form and details may be made without departing from the spirit and scope of the invention. Accordingly, it is intended that the present invention only be limited by the claims set forth hereinbelow.

What is claimed is:

1. A circuit for adjusting the frequency of operation of an electronic time keeping device including a source of clock pulses, said circuit comprising:
   a. means for storing a numeric code representative of a time delay of said clock pulses having a plurality of data output terminals;
   b. means for counting a time interval in proportion to said numeric code, including a plurality of data input terminals coupled to respective ones of said data output terminals of said means for storing, a plurality of data output terminals, and a clock input terminal;
   c. circuit means having a first input coupled to the source of clock pulses, a first clock output terminal coupled to the clock input terminal of said means for counting, a plurality of data input terminals coupled to respective ones of said data output terminals of said means for counting and a second clock output terminal disposed for supplying clock pulses of an adjusted frequency to the electronic time keeping device.

2. A circuit as in claim 1 further including means for entering said numeric code into said means for storing.

3. A circuit as in claim 2 further characterized by said means for storing comprising a counter circuit.

4. A circuit as in claim 3 further characterized by said means for entering comprising a gating network responsive to a clock signal and set and display switches of the electronic time keeping device for supplying a series of pulses indicative of said numeric code to said counter circuit.

5. A circuit as in claim 1 further including means for periodically transferring said numeric code stored in said means for storing to said means for counting.

6. A circuit as in claim 5 further characterized by said means for periodically transferring comprising a gating network means having a first input terminal coupled to a clock pulse of a predetermined frequency, a plurality of said input terminals coupled to respective ones of said plurality of data output terminals of said means for storing, and having a plurality of data output terminals coupled to respective ones of said plurality of data input terminals of said means for counting.

7. A circuit as in claim 1 further characterized by said circuit means comprising:
   a. first gating means having a plurality of data input terminals coupled to respective ones of said data output terminals of said means for counting and having an output terminal;
   b. second gating means having a first input terminal coupled to the source of clock pulses, a second input terminal coupled to said output terminal of said first gating means, and an output terminal coupled to the clock input terminal of said means for counting; and,
   c. third gating means having a first input terminal coupled to the source of clock pulses, a second input terminal coupled to said output terminal of said first gating means, and an output terminal disposed for providing clock pulses to the time keeping device, whereby clock pulses supplied to said time keeping device are periodically interrupted for a period of time determined by said numeric code stored in said means for storing.

8. A method of adjusting the frequency of operation of an electronic time keeping device, which device includes a source of clock pulses, comprising the steps of:
   a. inserting a numeric code into a progammable counter;
   b. storing the numeric code in the programmable counter;
   c. displaying the numeric code stored;
   d. transferring the numeric code to a time delay counter; and
   e. supplying signals from the time delay counter to a gating network to thereby interrupt the source of clock pulses at desired intervals.

* * * * *